United States Patent
Uzumaki et al.

(10) Patent No.: US 12,286,718 B2
(45) Date of Patent: Apr. 29, 2025

(54) METHOD FOR PRODUCING NITRIDE SEMICONDUCTOR PHOTOELECTRODE

(71) Applicant: Nippon Telegraph and Telephone Corporation, Tokyo (JP)

(72) Inventors: Yuya Uzumaki, Musashino (JP); Sayumi Sato, Musashino (JP); Yoko Ono, Musashino (JP); Takeshi Komatsu, Musashino (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 823 days.

(21) Appl. No.: 17/292,361

(22) PCT Filed: Nov. 19, 2019

(86) PCT No.: PCT/JP2019/045259
§ 371 (c)(1),
(2) Date: May 7, 2021

(87) PCT Pub. No.: WO2020/116151
PCT Pub. Date: Jun. 11, 2020

(65) Prior Publication Data
US 2022/0002886 A1  Jan. 6, 2022

(30) Foreign Application Priority Data
Dec. 3, 2018 (JP) .................. 2018-226249

(51) Int. Cl.
*C25B 9/50* (2021.01)
*C23C 14/02* (2006.01)
(Continued)

(52) U.S. Cl.
CPC .............. *C25B 9/50* (2021.01); *C23C 14/024* (2013.01); *C23C 14/14* (2013.01); *C23C 14/221* (2013.01);
(Continued)

(58) Field of Classification Search
CPC ....... C25B 9/50; C25B 11/049; C23C 14/024; C23C 14/04; C23C 14/221;
(Continued)

(56) References Cited

U.S. PATENT DOCUMENTS 6,420,736 B1 * 7/2002 Chen ...................... H01L 33/42
257/E33.07
6,996,150 B1 * 2/2006 Shakuda ............ H02K 15/0273
372/46.01
(Continued)

FOREIGN PATENT DOCUMENTS

JP  2010-10591 A  1/2010
JP  2013-115112 A  6/2013
(Continued)

OTHER PUBLICATIONS

Satoshi Yotsuhashi et al., $CO_2$ *Conversion with Light and Water by GaN Photoelectrode*, Japanese Journal of Applied Physics, the Japan Society of Applied Physics, vol. 51, 2021, pp. 02BP07-1-02BP07-3.
(Continued)

*Primary Examiner* — Brian K Talbot
(74) *Attorney, Agent, or Firm* — Workman Nydegger

(57) ABSTRACT

Provided is a method for producing a nitride semiconductor photoelectrode capable of improving the light energy conversion efficiency. The method for producing a nitride semiconductor photoelectrode includes a first step of forming an n-type gallium nitride layer on an insulating or conductive substrate, a second step of forming an indium gallium nitride layer on the n-type gallium nitride layer, a third step of forming a nickel layer n the indium gallium nitride layer, and a fourth step of heat-treating the nickel layer in an oxygen atmosphere.

7 Claims, 2 Drawing Sheets

(51) Int. Cl.
*C23C 14/14* (2006.01)
*C23C 14/22* (2006.01)
*C23C 14/58* (2006.01)
*C23C 16/18* (2006.01)
*C23C 16/34* (2006.01)
*C25B 11/049* (2021.01)
*H01L 21/02* (2006.01)
*H01L 21/285* (2006.01)

(52) U.S. Cl.
CPC .......... *C23C 14/5806* (2013.01); *C23C 16/18* (2013.01); *C23C 16/34* (2013.01); *C25B 11/049* (2021.01); *H01L 21/0228* (2013.01); *H01L 21/28556* (2013.01)

(58) Field of Classification Search
CPC ..... C23C 14/5806; C23C 16/18; C23C 16/34; H01L 21/0228; H01L 21/28556
USPC ....................................... 427/255.7
See application file for complete search history.

(56) References Cited

U.S. PATENT DOCUMENTS

| | | | | |
|---|---|---|---|---|
| 8,258,541 | B2* | 9/2012 | Muraki | H01L 33/38 257/103 |
| 10,087,533 | B2* | 10/2018 | Sekimoto | B01J 19/127 |
| 10,316,417 | B2* | 6/2019 | Okamoto | C25B 9/23 |
| 10,458,038 | B2* | 10/2019 | Zhang | H01L 21/0237 |
| 2004/0129891 | A1* | 7/2004 | Takagi | H01J 49/025 250/397 |
| 2006/0234411 | A1* | 10/2006 | Ryu | H01L 33/40 438/46 |
| 2007/0170457 | A1* | 7/2007 | Kobayakawa | H01L 21/02502 257/E21.121 |
| 2008/0054296 | A1* | 3/2008 | Yoon | H01L 21/0254 257/E33.028 |
| 2009/0321714 | A1 | 12/2009 | Muramoto et al. | |
| 2010/0273290 | A1* | 10/2010 | Kryliouk | C23C 16/303 257/E51.001 |
| 2013/0126892 | A1* | 5/2013 | Yu | H10D 62/85 438/513 |
| 2019/0214531 | A1* | 7/2019 | Ng | H10F 77/306 |
| 2021/0086170 | A1* | 3/2021 | Isimjan | B01J 35/45 |

FOREIGN PATENT DOCUMENTS

| | | |
|---|---|---|
| JP | 2017-17173 A | 1/2017 |
| JP | 2017-210666 A | 11/2017 |
| JP | 2018-204044 A | 12/2018 |

OTHER PUBLICATIONS

Yoko Ono et al., *Effect of NiO Protective Layer on Photocurrent Properties of GaN-based Photoanode*, 2017 Electrochemical Autumn Meeting 1L31, Sep. 10, 2017, pp. 1.

Takeyuki Sekimoto et al., *Analysis of Products from Photoelectrochemical Reduction of 13CO$_2$ by GaN—Si Based Tandem Photoelectrode*, Journal of Physical Chemistry C, vol. 120, No. 26, 2016, pp. 13970-13975.

* cited by examiner

METHOD FOR PRODUCING NITRIDE SEMICONDUCTOR PHOTOELECTRODE

TECHNICAL FIELD

The present invention relates to a method for producing a nitride semiconductor photoelectrode having a photocatalytic function that exhibits a catalytic function by light irradiation to cause a chemical reaction of an oxidation target material or a reduction target material.

BACKGROUND ART

As a related art example, FIG. 3 illustrates an apparatus for decomposing water using a semiconductor photoelectrode. The water decomposition reaction using a photocatalyst is composed of an oxidation reaction of water and a reduction reaction of protons, and they are as follows. When the n-type photocatalyst material is irradiated with light, electrons and holes are produced and separated in the photocatalyst. The holes move to the surface of the photocatalyst material and contribute to the oxidation reaction of water. On the other hand, the electrons move to the reduction electrode and contribute to the reduction reaction of protons. Ideally, such a redox reaction proceeds and a water splitting reaction occurs.

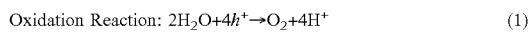

Oxidation Reaction: $2H_2O + 4h^+ \rightarrow O_2 + 4H^+$      (1)

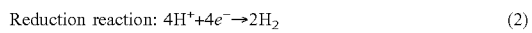

Reduction reaction: $4H^+ + 4e^- \rightarrow 2H_2$      (2)

Specifically, as illustrated in FIG. 3, an oxidation tank 110 includes an aqueous solution 111 and an oxidation electrode 112. The oxidation electrode 112 is in contact with the aqueous solution 111. The aqueous solution 111 is, for example, an aqueous solution of sodium hydroxide, an aqueous solution of potassium hydroxide, or hydrochloric acid. The oxidation electrode 112 is a nitride semiconductor, titanium oxide, or amorphous silicon. The reduction tank 120 includes an aqueous solution 121 and a reduction electrode 122. The reduction electrode 122 is in contact with the aqueous solution 121. The aqueous solution 121 is, for example, a potassium hydrogen carbonate aqueous solution, a sodium hydrogen carbonate aqueous solution, a potassium chloride aqueous solution, or a sodium chloride aqueous solution. The reduction electrode 122 is a metal or a metal compound such as nickel, iron, gold, platinum, silver, copper, indium, and titanium. A proton membrane 130 is sandwiched between the oxidation tank 110 and the reduction tank 120, and the protons produced in the oxidation tank 110 diffuse into the reduction tank 120 via the proton membrane 130. The proton membrane 130 is, for example, Nafion (trade name), which is a perfluorocarbon material composed of a hydrophobic Teflon skeleton that is carbon-fluorine based and a perfluoro side chain having a sulfonic acid group. The oxidation electrode 112 and the reduction electrode 122 are electrically connected by a lead 132, and electrons are transferred from the oxidation electrode 112 to the reduction electrode 122. The light source 140 is, for example, a xenon lamp, a mercury lamp, a halogen lamp, a simulated solar source, sunlight, or a combination thereof. Light having a wavelength that can be absorbed by the material forming the oxidation electrode 112 is irradiated. For example, in an electrode composed of gallium nitride, the absorbable wavelength is 365 nm or less.

FIG. 4 illustrates the configuration (cross section) of an oxidation electrode 112 in the related art. In the related-art example as illustrated in FIG. 4, the oxidation electrode 112 is a semiconductor thin film, and for example, the gallium nitride thin film 12 grown on a sapphire substrate 11 is used. Further, nickel oxide 13 is formed on the gallium nitride thin film 12 as a co-catalyst for oxygen generation. In the related art, a nickel thin film (about 1 nm) is vapor-deposited on the gallium nitride thin film 12 and heat-treated in the air for about 1 hour on a hot plate set at about 300° C. to form nickel oxide 13.

CITATION LIST

Non Patent Literature

Non Patent Literature (NPL) 1: S. Yotsuhashi, et al., "CO2 Conversion with Light and Water by GaN Photoelectrode", Japanese Journal of Applied Physics, The Japan Society of Applied Physics, 2012, Volume 51, pp. 02BP07-1-02BP07-3.

NPL 2: Yoko Ono et al., "Effects of NiO Thin Film Formed on Nitride Semiconductor Electrodes on Photocurrent Characteristics", 2017 Autumn Meeting of Electrochemical Society of Japan, 1L31.

SUMMARY OF THE INVENTION

Technical Problem

When the oxidation electrode 112 as illustrated in FIG. 4 is used, of the electrons and holes generated in the gallium nitride thin film 12, holes move from the gallium nitride thin film 12 to the nickel oxide 13, and the oxidation reaction of water proceeds on the surface of the nickel oxide 13. In order for holes to move smoothly, the valence band of the gallium nitride semiconductor needs to be at a level lower than that of nickel oxide. However, for example, when a visible-responsive semiconductor photocatalyst thin film expected to improve the light absorption rate such as indium gallium nitride is used, the level of the valence band becomes higher as the band gap becomes narrower. The valence band of the nickel oxide 13 produced by the related-art method is located at a level lower than the valence band of the visible-responsive semiconductor photocatalyst thin film, and a barrier that prevents holes from moving is generated. Therefore, even if the light absorptance is improved, there is a problem in which holes cannot move due to the generated barrier, and the light energy conversion efficiency is lowered.

The present invention has been made in view of the above-described related-art technique, and is intended to provide a method for producing a nitride semiconductor photoelectrode capable of improving the light energy conversion efficiency.

Means for Solving the Problem

In order to achieve the above object, a first aspect in accordance with the present invention provides a method for producing a nitride semiconductor photoelectrode, which includes a first step of forming an n-type gallium nitride layer on an insulating or conductive substrate, a second step of forming an indium gallium nitride layer on the n-type gallium nitride layer, a third step of forming a nickel layer on the indium gallium nitride layer, and a fourth step of heat-treating the nickel layer in an oxygen atmosphere.

A second aspect in accordance with the present invention provides the method according to the first aspect, in which metal organic chemical vapor deposition (MOCVD) is used in the first step and the second step.

A third aspect in accordance with the present invention provides the method according to the first or second aspect, in which electron beam (EB) vapor deposition is used in the third step.

A fourth aspect in accordance with the present invention provides the invention according to any one of the first to third aspects, in which the fourth step is performed at a temperature from 250 to 400° C. for a holding time from 30 minutes to 2 hours.

A fifth aspect in accordance with the present invention provides the method according to any one of the first to fourth aspects, in which the nickel layer after the fourth step becomes an oxygen-excessive nickel oxide layer and exhibits characteristics as a p-type semiconductor.

Effects of the Invention

According to the present invention, it is possible to provide a method for producing a nitride semiconductor photoelectrode capable of improving the light energy conversion efficiency.

DESCRIPTION OF EMBODIMENTS

Hereinafter, the present invention will be described in more detail with reference to Examples, but the present invention is not limited to these Examples, and changes may be made without departing from the spirit of the present invention.

Overview

In the present invention, in order to reduce the barrier generated in the valence band when the charge generated in the nitride semiconductor thin film is transferred to the oxygen generation co-catalyst, the oxygen generation co-catalyst is heat-treated in an oxygen atmosphere to produce an oxygen-excessive oxide material which is a p-type conductor, and the light energy conversion efficiency is improved by the use of a nitride semiconductor photoelectrode having an interface in which the valence band of the oxygen generation co-catalyst is at a higher level than the valence band of the nitride semiconductor thin film.

Example 1

Production of Nitride Semiconductor Photoelectrode

Figure 1:
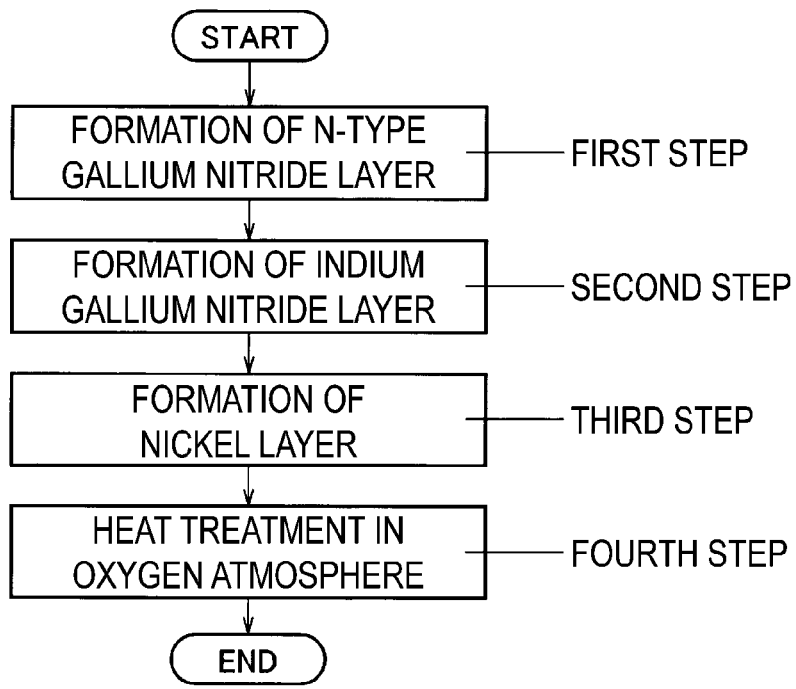
FIG. 1 is a diagram illustrating a producing process of a nitride semiconductor photoelectrode in an example of the present invention.

FIG. 1 illustrates a producing process of the nitride semiconductor photoelectrode in Example 1.

A sapphire substrate was used as the substrate. An n-GaN semiconductor thin film doped with silicon was epitaxially grown by MOCVD on a 2-inch sapphire substrate (first step). Ammonia gas and trimethylgallium were used as growth raw materials, silane gas was used as an n-type impurity source, and hydrogen was used as a carrier gas to be fed into a growth furnace. The film thickness of n-GaN was set to 2 μm, which is sufficient to absorb light. The carrier density was $3 \times 10^{18}$ cm$^{-3}$. Thereafter, indium gallium nitride (InGaN) with an indium composition ratio of 5% was grown (second step). Ammonia gas, trimethylgallium, and trimethylindium were used as growth raw materials, and hydrogen was used as a carrier gas to be fed into the growth furnace. The film thickness was 100 nm, which is sufficient to sufficiently absorb light. Then, a 2-inch semiconductor thin film was cleaved into four equal parts, and one of them was used for electrode production. Next, Ni having a film thickness of about 1 nm was EB-deposited on the surface of InGaN (third step). Then, this semiconductor thin film was put into an electric furnace and heat-treated at 200° C. for 15 minutes in an oxygen atmosphere (fourth step).

As a result of elemental analysis of the cross section, Ni and O were detected, indicating that NiO was formed. The TEM observation result of the cross section revealed that the film thickness of NiO was about 2 nm. Further, the titration of the formed NiO revealed that O was excessively contained with respect to Ni.

Configuration of Nitride Semiconductor Photoelectrode

Figure 2:
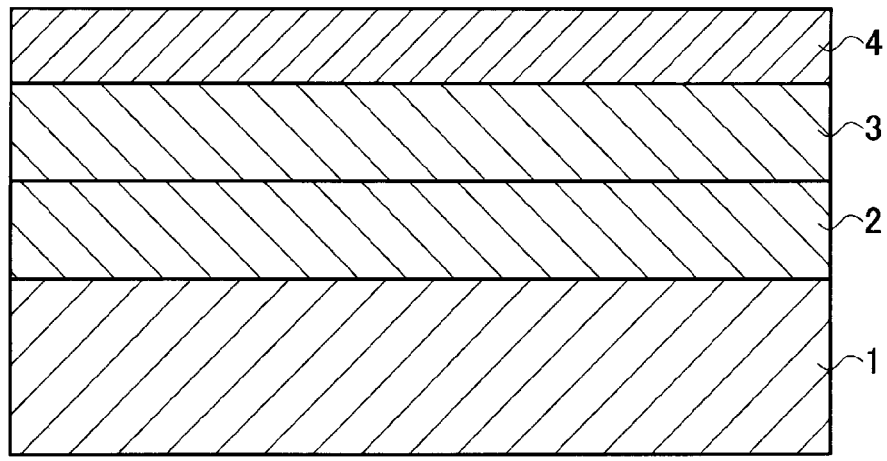
FIG. 2 is a cross-sectional view of a nitride semiconductor photoelectrode in an example of the present invention.

FIG. 2 is a cross-sectional view illustrating the configuration of the nitride semiconductor photoelectrode in Example 1. As illustrated in FIG. 2, the nitride semiconductor photoelectrode in Example 1 has an insulating or conductive substrate (sapphire substrate) 1, an n-type gallium nitride (n-GaN) layer 2 disposed on the substrate 1, an indium gallium nitride (InGaN) layer 3 disposed on the n-type gallium nitride layer 2, and an oxygen-excessive nickel oxide (NiO) layer 4 disposed on the indium gallium nitride layer 3.

Nickel oxide, which is a co-catalyst for oxygen generation, exhibits characteristics as a p-type semiconductor when it has an oxygen-excessive composition. As a result, by producing a nitride semiconductor photoelectrode in which oxygen-excessive nickel oxide is formed on the indium gallium nitride semiconductor thin film, holes generated in the indium gallium nitride semiconductor thin film by light irradiation can move to nickel oxide. In this manner, it is possible to improve the light energy conversion efficiency by promoting charge separation (generation and separation of electrons and holes) in the semiconductor electrode.

Redox Reaction Test

Figure 3:
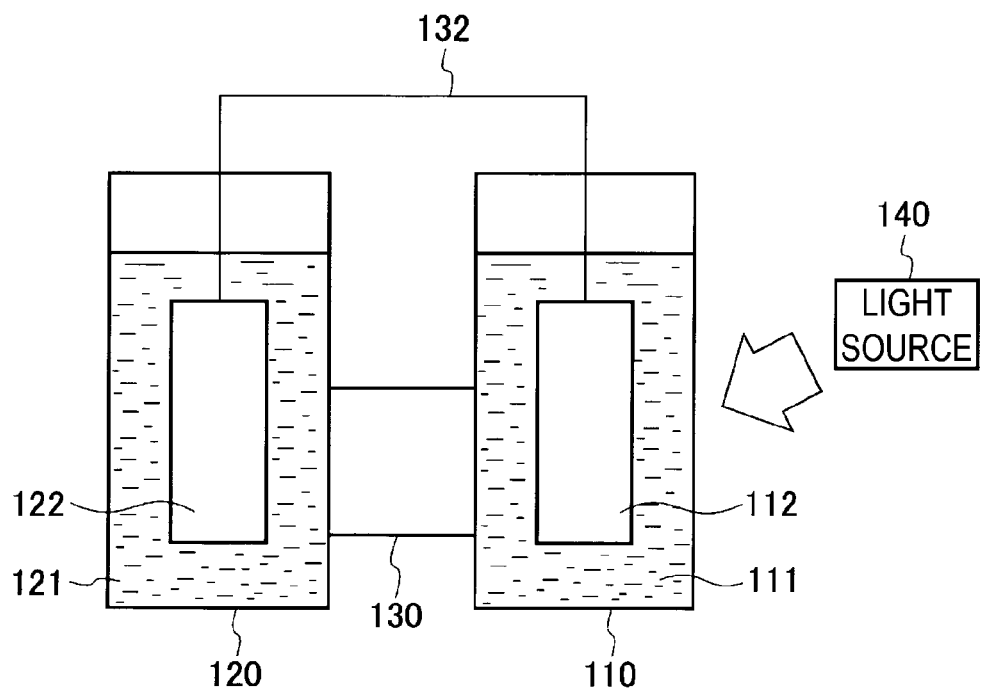
FIG. 3 is a configuration diagram of a water decomposing device using a semiconductor photoelectrode.
Figure 4:
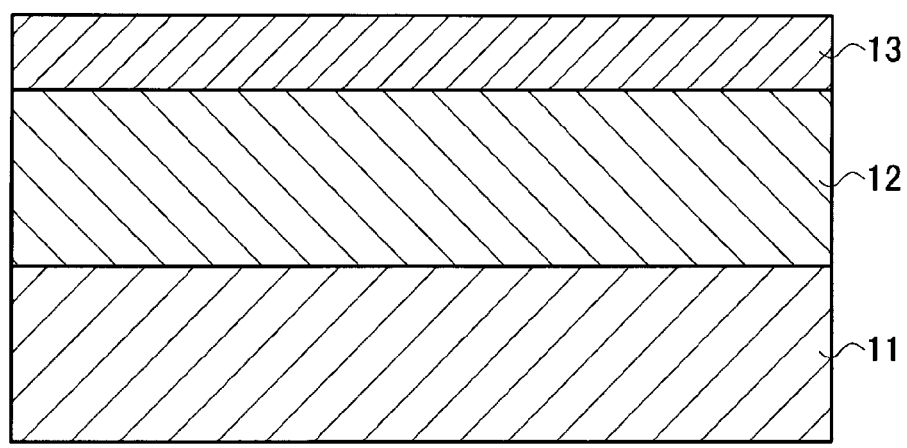
FIG. 4 is a cross-sectional view of an oxidation electrode in the related art.

Next, the redox reaction test in Example 1 will be described. Here again, the configuration diagram of the water decomposition apparatus (FIG. 3) is used, but detailed description of the points already described will be omitted.

In the redox reaction test, the surface of InGaN was scribed and the surface of n-GaN was exposed. A lead was connected to a part of the exposed n-GaN surface, and soldering was performed using indium (In). Then, it was covered with an epoxy resin so that the indium surface was not exposed. This was installed as the oxidation electrode 112 in FIG. 3. The aqueous solution 111 was a 1 mol/L aqueous solution of sodium hydroxide. Here, the aqueous solution 121 was a 0.5 mol/L aqueous solution of potassium hydrogen carbonate. Platinum (manufactured by The Nilaco Corporation) was used for the reduction electrode 122, and Nafion (trade name) was used for the proton membrane 130. Nitrogen gas was passed at 10 mL/min in each or the reaction tanks 110 and 120, the light irradiation area of the sample was set to 1 cm$^2$, and the aqueous solutions 111 and 121 were stirred at the center position of the bottom of each of the reaction tanks 110 and 120 at a rotation speed of 250 rpm using a stirring bar and a stirrer. After the insides of the reaction tanks 110 and 120 were sufficiently replaced with nitrogen gas, the light source 140 was fixed so as to face the surface of the semiconductor photoelectrode produced by the above-mentioned procedure on which NiO was formed. A 300 W high-pressure xenon lamp (illuminance: 5 mW/cm$^2$) was used as the light source 140, and the semiconductor photoelectrode was uniformly irradiated with light. The gas in each of the reaction tanks 110 and 120 was sampled at any time during the light irradiation, and the reaction product was analyzed by a gas chromatograph. As a result, it was confirmed that oxygen was generated in the oxidation tank 110 and hydrogen was generated in the reduction tank 120.

Example 2

In Example 2, the heat treatment step (fourth step) of Example 1 was performed at 200° C. for 30 minutes to produce a nitride semiconductor electrode. Other procedures are the same as those in Example 1.

Example 3

In Example 3, the heat treatment step of Example 1 was performed at 200° C. for 1 hour to produce a nitride semiconductor electrode. Other procedures are the same as those in Example 1.

Example 4

In Example 4, the heat treatment step of Example 1 was performed at 200° C. for 2 hours to produce a nitride semiconductor electrode. Other procedures are the same as those in Example 1.

Example 5

In Example 5, the heat treatment step of Example 1 was performed at 200° C. for 3 hours to produce a nitride semiconductor electrode. Other procedures are the same as those in Example 1.

Example 6

In Example 6, the heat treatment step of Example 1 was performed at 200° C. for 4 hours to produce a nitride semiconductor electrode. Other procedures are the same as those in Example 1.

Example 7

In Example 7, the heat treatment step of Example 1 was performed at 250° C. for 15 minutes to produce a nitride semiconductor electrode. Other procedures are the same as those in Example 1.

Example 8

In Example 8, the heat treatment step of Example 1 was performed at 250° C. for 30 minutes to produce a nitride semiconductor electrode. Other procedures are the same as those in Example 1.

Example 9

In Example 9, the heat treatment step of Example 1 was performed at 250° C. for 1 hour to produce a nitride semiconductor electrode. Other procedures are the same as those in Example 1.

Example 10

In Example 10, the heat treatment step of Example 1 was performed at 250° C. for 2 hours to produce a nitride semiconductor electrode. Other procedures are the same as those in Example 1.

Example 11

In Example 11, the heat treatment step of Example 1 was performed at 250° C. for 3 hours to produce a nitride semiconductor electrode. Other procedures are the same as those in Example 1.

Example 12

In Example 12, the heat treatment step of Example 1 was performed at 250° C. for 4 hours to produce a nitride semiconductor electrode. Other procedures are the same as those in Example 1.

Example 13

In Example 13, the heat treatment step of Example 1 was performed at 300° C. for 15 minutes to produce a nitride semiconductor electrode. Other procedures are the same as those in Example 1.

Example 14

In Example 14, the heat treatment step of Example 1 was performed at 300° C. for 30 minutes to produce a nitride semiconductor electrode. Other procedures are the same as those in Example 1.

Example 15

In Example 15, the heat treatment step of Example 1 was performed at 300° C. for 1 hour to produce a nitride semiconductor electrode. Other procedures are the same as those in Example 1.

Example 16

In Example 16, the heat treatment step of Example 1 was performed at 300° C. for 2 hours to produce a nitride semiconductor electrode. Other procedures are the same as those in Example 1.

Example 17

In Example 17, the heat treatment step of Example 1 was performed at 300° C. for 3 hours to produce a nitride semiconductor electrode. Other procedures are the same as those in Example 1.

Example 18

In Example 18, the heat treatment step of Example 1 was performed at 300° C. for 4 hours to produce a nitride semiconductor electrode. Other procedures are the same as those in Example 1.

Example 19

In Example 19, the heat treatment step of Example 1 was performed at 400° C. for 15 minutes to produce a nitride semiconductor electrode. Other procedures are the same as those in Example 1.

Example 20

In Example 20, the heat treatment step of Example 1 was performed at 400° C. for 30 minutes to produce a nitride semiconductor electrode. Other procedures are the same as those in Example 1.

Example 21

In Example 21, the heat treatment step of Example 1 was performed at 400° C. for 1 hour to produce a nitride semiconductor electrode. Other procedures are the same as those in Example 1.

Example 22

In Example 22, the heat treatment step of Example 1 was performed at 400° C. for 2 hours to produce a nitride semiconductor electrode. Other procedures are the same as those in Example 1.

Example 23

In Example 23, the heat treatment step of Example 1 was performed at 400° C. for 3 hours to produce a nitride semiconductor electrode. Other procedures are the same as those in Example 1.

Example 24

In Example 24, the heat treatment step of Example 1 was performed at 400° C. for 4 hours to produce a nitride semiconductor electrode. Other procedures are the same as those in Example 1.

Example 25

In Example 25, the heat treatment step of Example 1 was performed at 500° C. for 15 minutes to produce a nitride semiconductor electrode. Other procedures are the same as those in Example 1.

Example 26

In Example 26, the heat treatment step of Example 1 was performed at 500° C. for 30 minutes to produce a nitride semiconductor electrode. Other procedures are the same as those in Example 1.

Example 27

In Example 27, the heat treatment step of Example 1 was performed at 500° C. for 1 hour to produce a nitride semiconductor electrode. Other procedures are the same as those in Example 1.

Example 28

In Example 28, the heat treatment step of Example 1 was performed at 500° C. for 2 hours to produce a nitride semiconductor electrode. Other procedures are the same as those in Example 1.

Example 29

In Example 29, the heat treatment step of Example 1 was performed at 500° C. for 3 hours to produce a nitride semiconductor electrode. Other procedures are the same as those in Example 1.

Example 30

In Example 30, the heat treatment step of Example 1 was performed at 500° C. for 4 hours to produce a nitride semiconductor electrode. Other procedures are the same as those in Example 1.

Comparative Example 1

In Comparative Example 1, the heat treatment step of Example 8 was performed in an air atmosphere to produce a nitride semiconductor electrode. Other procedures are the same as those in Example 1.

Comparative Example 2

In Comparative Example 2, the heat treatment step of Example 9 was performed in an air atmosphere to produce a nitride semiconductor electrode. Other procedures are the same as those in Example 1.

Comparative Example 3

In Comparative Example 3, the heat treatment step of Example 10 was performed in an air atmosphere to produce a nitride semiconductor electrode. Other procedures are the same as those in Example 1.

Comparative Example 4

In Comparative Example 4, the heat treatment step of Example 14 was performed in an air atmosphere to produce a nitride semiconductor electrode. Other procedures are the same as those in Example 1.

Comparative Example 5

In Comparative Example 5, the heat treatment step of Example 15 was performed in an air atmosphere to produce a nitride semiconductor electrode. Other procedures are the same as those in Example 1.

Comparative Example 6

In Comparative Example 6, the heat treatment step of Example 16 was performed in an air atmosphere to produce a nitride semiconductor electrode. Other procedures are the same as those in Example 1.

Comparative Example 7

In Comparative Example 7, the heat treatment step of Example 20 was performed in an air atmosphere to produce a nitride semiconductor electrode. Other procedures are the same as those in Example 1.

Comparative Example 8

In Comparative Example 8, the heat treatment step of Example 21 was performed in an air atmosphere to produce a nitride semiconductor electrode. Other procedures are the same as those in Example 1.

Comparative Example 9

In Comparative Example 9, the heat treatment step of Example 22 was performed in an air atmosphere to produce a nitride semiconductor electrode. Other procedures are the same as those in Example 1.

Effects of Embodiments

Table 1 shows the amounts of oxygen and hydrogen gases generated 10 hours after the light irradiation in Examples and Comparative Examples. The generated amount of each gas was normalized by the surface area of the semiconductor photoelectrode. It was found that oxygen and hydrogen were generated upon irradiation with light in all cases.

It was found that the generated amounts of hydrogen and oxygen in Examples 8, 9, 10, 14, 15, 16, 20, 21, and 22 were 10 times higher than those in other Examples.

In Examples 1, 2, 3, 4, 5, and 6, the generated amounts of hydrogen and oxygen were low at any heat treatment holding time. The reason for this is likely that Ni was not sufficiently oxidized or NiO was not oxygen-excessive when the heat treatment temperature was 200° C. or lower.

In Examples 25, 26, 27, 28, 29 and 30, the generated amounts of hydrogen and oxygen were low at any heat treatment temperature holding time. The reason for this is likely that Ni rapidly oxidized and thermally expanded to NiO by the high temperature heat treatment when the heat treatment temperature was 500° C. or higher, and voids were generated at the interface with the photocatalytic thin film, whereby deterioration of the electrode performance was started from the voids, and the catalytic activity was almost deactivated after 10 hours.

In Examples 7, 13, and 19, the generated amounts of hydrogen and oxygen were low at any heat treatment temperature. The reason for this is likely that Ni was not sufficiently oxidized or NiO was not oxygen-excessive when the heat treatment holding time was 15 minutes or less.

In Examples 11, 12, 17, 18, 23, and 24, the generated amounts of hydrogen and oxygen were low at any heat treatment temperature. The reason for this is likely that Ni oxidized and thermally expanded to NiO by the heat treatment for a long time when the heat treatment holding time was 3 hours or longer, and voids were generated at the interface with the photocatalytic thin film, whereby deterioration of the electrode performance was started from the voids, and the catalytic activity was almost deactivated after 10 hours.

From these results, the heat treatment conditions for forming NiO are as follows: temperature is from 250 to 400° C., and holding time is from 30 minutes to 2 hours. In addition, the generated amounts of hydrogen and oxygen in Examples 8, 9, 10, 14, 15, 16, 20, 21, 22 were 10 times higher than those in Comparative Examples 1, 3, 4, 5, 6, 7, 8, and 9, indicating that the atmosphere during heat treatment must be an oxygen atmosphere. When the atmosphere is air, NiO does not become oxygen-excessive NiO and holes cannot move through the barrier at the interface between NiO and InGaN, which likely influence the result.

From the above, by performing the heat treatment step in an oxygen atmosphere at a temperature from 250 to 400° C. for a holding time from 30 minutes to 2 hours, the generated amounts of hydrogen and oxygen by the water splitting reaction was increased (the light energy conversion efficiency was increased).

TABLE 1

| | Heat treatment conditions | | | Amount of gas generated in cell/μmol $cm^{-2} \cdot h^{-1}$ 10 hours after irradiation | |
|---|---|---|---|---|---|
| Example | Atmosphere | Temperature | Holding time | Enzyme | Hydrogen |
| Example 1 | Oxygen | 200° C. | 15 min | 1.2 | 2.5 |
| Example 2 | Oxygen | 200° C. | 30 min | 1.1 | 2.3 |
| Example 3 | Oxygen | 200° C. | 1 h | 1.3 | 2.5 |
| Example 4 | Oxygen | 200° C. | 2 h | 1.0 | 2.2 |
| Example 5 | Oxygen | 200° C. | 3 h | 1.2 | 2.5 |
| Example 6 | Oxygen | 200° C. | 4 h | 1.1 | 2.3 |
| Example 7 | Oxygen | 250° C. | 15 min | 1.3 | 2.5 |
| Example 8 | Oxygen | 250° C. | 30 min | 10.5 | 21.1 |
| Example 9 | Oxygen | 250° C. | 1 h | 10.6 | 21.3 |
| Example 10 | Oxygen | 250° C. | 2 h | 10.7 | 21.5 |
| Example 11 | Oxygen | 250° C. | 3 h | 0.9 | 1.9 |
| Example 12 | Oxygen | 250° C. | 4 h | 1.0 | 2.1 |
| Example 13 | Oxygen | 300° C. | 15 min | 1.0 | 2.0 |
| Example 14 | Oxygen | 300° C. | 30 min | 10.8 | 21.0 |
| Example 15 | Oxygen | 300° C. | 1 h | 10.4 | 20.9 |
| Example 16 | Oxygen | 300° C. | 2 h | 11.0 | 21.9 |
| Example 17 | Oxygen | 300° C. | 3 h | 1.1 | 2.2 |
| Example 18 | Oxygen | 300° C. | 4 h | 1.0 | 2.0 |
| Example 19 | Oxygen | 400° C. | 15 min | 1.1 | 1.9 |
| Example 20 | Oxygen | 400° C. | 30 min | 10.9 | 21.1 |
| Example 21 | Oxygen | 400° C. | 1 h | 10.2 | 20.5 |
| Example 22 | Oxygen | 400° C. | 2 h | 10.1 | 20.0 |
| Example 23 | Oxygen | 400° C. | 3 h | 1.1 | 2.2 |
| Example 24 | Oxygen | 400° C. | 4 h | 1.2 | 2.4 |
| Example 25 | Oxygen | 500° C. | 15 min | 1.0 | 1.9 |
| Example 26 | Oxygen | 500° C. | 30 min | 1.1 | 2.2 |
| Example 27 | Oxygen | 500° C. | 1 h | 1.2 | 2.3 |
| Example 28 | Oxygen | 500° C. | 2 h | 0.9 | 1.8 |
| Example 29 | Oxygen | 500° C. | 3 h | 1.0 | 2.1 |
| Example 30 | Oxygen | 500° C. | 4 h | 1.1 | 2.2 |
| Comparative Example 1 | Air | 250° C. | 30 min | 1.1 | 2.1 |
| Comparative Example 2 | Air | 250° C. | 1 h | 0.9 | 1.8 |
| Comparative Example 3 | Air | 250° C. | 2 h | 1.0 | 2.0 |
| Comparative Example 4 | Air | 300° C. | 30 min | 1.0 | 2.0 |
| Comparative Example 5 | Air | 300° C. | 1 h | 1.2 | 2.3 |
| Comparative Example 6 | Air | 300° C. | 2 h | 1.1 | 2.2 |
| Comparative Example 7 | Air | 400° C. | 30 min | 1.0 | 2.1 |
| Comparative Example 8 | Air | 400° C. | 1 h | 1.0 | 2.2 |
| Comparative Example 9 | Air | 400° C. | 2 h | 0.9 | 2.1 |

Modification Example

Although some Examples have been described above, it should be understood that the discussion and drawings which form a part of the disclosure are illustrative and are not intended to be limiting. From this disclosure, various alternative embodiments and operation techniques will be apparent to those skilled in the art.

For example, although the fourth step was performed in an electric furnace in Examples, it may be heat treatment on a hot plate installed in a groove box in an oxygen atmosphere. The aqueous solution 111 used for the redox reaction test is not necessarily an aqueous solution of potassium hydroxide, and may be an aqueous solution of potassium hydroxide or hydrochloric acid. The aqueous solution 121 is not necessarily an aqueous solution of potassium hydrogen carbonate, and may be an aqueous solution of sodium hydrogen carbonate, an aqueous solution of potassium chloride, or an aqueous solution of sodium chloride other. Although the target product was hydrogen in Examples, it is possible to generate a carbon compound by a reduction reaction of carbon dioxide or ammonia by a reduction reaction of nitrogen by changing the reduction electrode 122 (for example, Ni, Fe, Au, Pt, Ag, Cu, In, Ti, Co, or Ru) or the atmosphere in the cell.

Supplement

As described above, the method for producing a nitride semiconductor photoelectrode according to the embodiment of the present invention includes a first step of forming an n-type gallium nitride layer 2 on an insulating or conductive substrate 1, a second step of forming an indium gallium nitride layer 3 on the n-type gallium nitride layer 2, a third step of forming a nickel layer 4 on the indium gallium nitride layer 3, and a fourth step of heat-treating the nickel layer 4 in an oxygen atmosphere. Thus, by forming nickel on the indium gallium nitride semiconductor thin film and then heat-treating it in an oxygen atmosphere to produce a nitride semiconductor photoelectrode in which oxygen-excessive nickel oxide is formed, an oxygen generation co-catalyst that does not generate a barrier against which holes cannot move is formed on a semiconductor thin film having a high light absorption rate, whereby the light energy conversion efficiency is improved.

In the first step and the second step, it is preferable to use metal organic chemical vapor deposition (MOCVD). As a result, there is less deviation in film thickness and faster growth is possible compared to other methods, which allows efficient production of semiconductor photoelectrodes with reduced charge transfer barriers.

In the third step, it is preferable to use electron beam (EB) vapor deposition. As a result, a thin film with higher purity can be formed as compared with other methods, which allows efficient production of a semiconductor photoelectrode having a reduced charge transfer barrier.

The fourth step is preferably performed at a temperature from 250 to 400° C. for a holding time from 30 minutes to 2 hours. This makes it possible to realize a nitride semiconductor photoelectrode that can maintain high light energy conversion efficiency for a long time.

The nickel layer 4 after the fourth step becomes the oxygen-excessive nickel oxide layer 4 and exhibits characteristics as a p-type semiconductor. This allows holes generated in the indium gallium nitride semiconductor thin film by light irradiation to move to nickel oxide.

REFERENCE SIGNS LIST

1 substrate
2 n-type gallium nitride layer
3 indium gallium nitride layer
4 nickel oxide layer (nickel layer)
110 oxidation tank
111 aqueous solution
112 oxidation electrode
120 reduction tank
121 aqueous solution
122 reduction electrode
130 proton membrane
132 lead
140 light source

The invention claimed is:

1. A method for producing a nitride semiconductor photoelectrode comprising:
a first step of forming a 2 μm thick n-type gallium nitride layer having a carrier density of $3 \times 10^{18}$ cm$^{-3}$ directly on an insulating or conductive substrate;
a second step of forming a 100 nm thick indium gallium nitride layer having an indium composition ratio of 5% directly on the n-type gallium nitride layer;
a third step of forming a 1 nm thick nickel layer directly on the indium gallium nitride layer; and
a fourth step of heat-treating the nickel layer in an oxygen atmosphere,
therein the 1 nm thick nickel layer after the fourth step becomes an oxygen-excessive nickel oxide layer having a 2 nm thickness and exhibits characteristics as a p-type semiconductor.

2. The method for producing a nitride semiconductor photoelectrode according to claim 1, wherein metal organic chemical vapor deposition (MOCVD) is used in the first step and the second step.

3. The method for producing a nitride semiconductor photoelectrode according to claim 1, wherein electron beam (EB) vapor deposition is used in the third step.

4. The method for producing a nitride semiconductor photoelectrode according to claim 1, wherein the fourth step is performed at a temperature from 250 to 400° C. for a holding time from 30 minutes to 2 hours.

5. The method for producing a nitride semiconductor photoelectrode according to claim 2, wherein electron beam (EB) vapor deposition is used in the third step.

6. The method for producing a nitride semiconductor photoelectrode according to claim 2, wherein the fourth step is performed at a temperature from 250 to 400° C. for a holding time from 30 minutes to 2 hours.

7. The method for producing a nitride semiconductor photoelectrode according to claim 3, wherein the fourth step is performed at a temperature from 250 to 400° C. for a holding time from 30 minutes to 2 hours.

\* \* \* \* \*